United States Patent [19]

Kimura

[11] Patent Number: 4,602,242
[45] Date of Patent: Jul. 22, 1986

[54] ENCODER FOR PHOTOELECTRIC MEASURING DEVICES

[75] Inventor: Kazuaki Kimura, Tokyo, Japan

[73] Assignee: Tokyo Kogaku Kikai Kabushiki Kaisha, Tokyo, Japan

[21] Appl. No.: 774,859

[22] Filed: Sep. 11, 1985

Related U.S. Application Data

[63] Continuation of Ser. No. 407,342, Aug. 12, 1982, abandoned.

[30] Foreign Application Priority Data

Aug. 13, 1981 [JP] Japan ................... 56-126013

[51] Int. Cl.$^4$ ............. G01D 5/34; H03K 13/00; H03K 13/18
[52] U.S. Cl. ............. 340/347 P; 250/231 SE; 340/347 M
[58] Field of Search ........ 340/347 P, 347 M, 347 CC; 250/231 SE, 237 R, 237 G, 209; 356/374; 33/125 C

[56] References Cited

U.S. PATENT DOCUMENTS

| | | | |
|---|---|---|---|
| 2,928,953 | 3/1960 | Bassler | 250/557 |
| 3,458,709 | 7/1969 | Beall, Jr. et al. | 250/231 SE |
| 3,509,562 | 4/1970 | Hafle | 340/347 M |
| 3,599,004 | 10/1971 | Grendelmeier | 250/209 X |
| 4,074,258 | 2/1978 | Dore et al. | 340/347 P |
| 4,100,420 | 7/1978 | Metcalf et al. | 250/231 SE X |
| 4,465,373 | 8/1984 | Tamaki et al. | 340/347 P X |

FOREIGN PATENT DOCUMENTS

| | | |
|---|---|---|
| 793022336 | 10/1979 | European Pat. Off. . |
| 0013799 | 6/1980 | European Pat. Off. . |
| 104815 | 6/1982 | Japan . |

OTHER PUBLICATIONS

Grim, Fiber Optics Applied to Control and Sensing Devices, Electro-Technology, vol. 70, No. 4, 10/1962, pp. 79–82.

Primary Examiner—T. J. Sloyan
Attorney, Agent, or Firm—Brumbaugh, Graves, Donohue & Raymond

[57] ABSTRACT

An encoder including a code carrying medium movable with respect to a photoelectrical sensor in one direction, the code carrying medium having a first track formed with a plurality of first blocks arranged along the aforementioned direction of movement of the code carrying medium, each of the first blocks carrying address information of the particular block recorded in a direction crossing the direction of movement of the code carrying medium, and a second track parallel with the first track and formed with a plurality of second blocks arranged along the direction of movement, each of the second blocks carrying reference position information representing a reference position of the particular one of the second blocks and a plurality of coded bar patterns arranged with a first predetermined pitch in series along the direction of movement of the code carrying medium. The photoelectrical sensor has a plurality of sensing elements arranged in series with a second predetermined pitch which is slightly different from the first predetermined pitch of the coded bar patterns to produce a vernier relationship with the coded bar patterns. The photoelectrical sensor is arranged with respect to the code carrying medium so that the sensing elements in the sensor read the information and patterns on the code carrying medium to produce an output representing a relative movement between the code carrying medium and the photoelectrical sensor.

2 Claims, 9 Drawing Figures

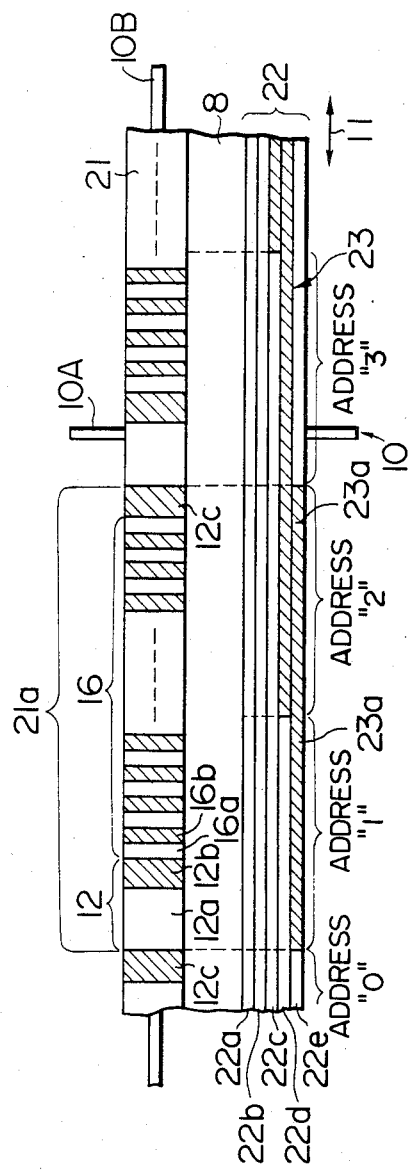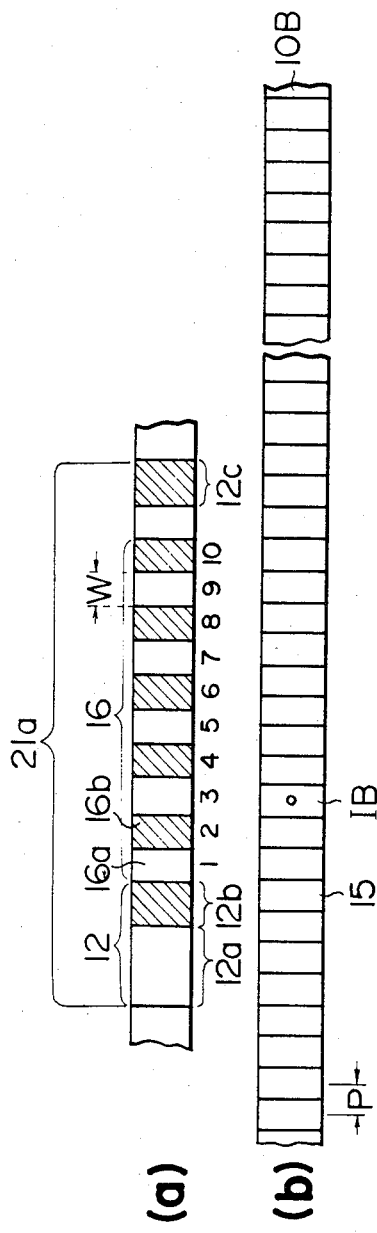

ENCODER FOR PHOTOELECTRIC MEASURING DEVICES

This application is a continuation of application Ser. No. 407,342, filed on Aug. 12, 1982, now abandoned.

The present invention relates to encoders for digitally reading a linear or angular length. More particularly, the present invention pertains to absolute encoders which include a code carrying medium having coded patterns such as binary codes and adapted to be advanced in one direction so that the coded patterns are read by photoelectrical means.

Such absolute encoders are considered as advantageous over incremental type encoders in that, even when there is an interruption of electric power supply or an erroneous operation due to electrical noises, a correct read out operation can be recovered as soon as a normal condition is restored. However, conventional encoders have disadvantages in that a large number of light sources and photoelectric elements are required for read out operations and that the resolving power is limited by the coded pattern forming technology and the sensitivity of the photoelectric elements.

In order to eliminate the above problems in conventional encoders, there has been proposed, by U.S. patent application Ser. No. 84159 filed on Oct. 12, 1979, an absolute encoder in which a fine read out can be made under the principle of a vernier scale. More specifically, the encoder includes a code carrying medium adapted to be advanced in one direction and having a plurality of blocks arranged in series in the direction of advancement. In each block, the code carrying medium has a mark pattern comprised of a character pattern and a reference position mark, a code bar pattern, and an address pattern including an address bar specific to the block. A line sensor including a plurality of photoelectric electric elements arranged in series is used for cooperation with the code carrying medium so that the medium is advanced with respect to the line sensor whereby the patterns on the medium are read by the sensor. The feature of the encoder is that the pitch of the code bars in the code bar pattern is slightly different from the pitch of the photoelectric elements in the line sensor. For example, a length of the code carrying medium corresponding to ten code bars may correspond to eleven photoelectric elements.

In operation of the proposed encoder, detection is at first made of a specific photoelectric element which is receiving the projection of the reference position mark. Then, the address of the block concerned is interpreted by detecting the address bar in the address pattern. Operation is then made to calculate the distance between a predetermined one of the photoelectric elements and the specific photoelectric element receiving the projection of the reference position mark to thereby obtain a rough value of the relative displacement of the code carrying medium with respect to the line sensor. A further fine read out is made under the principle of a vernier scale. The procedures for performing such fine read out are fully described in the aforementioned U.S. patent application.

The proposed encoder is advantageous in that the coded patterns can be provided on a single code track extending in the direction of movement of the code carrying medium and that a high precision read out can be made by utilizing the principle of vernier scale. The encoder is however found disadvantageous in that it is difficult to increase the read out speed. In usual applications of encoders, the read out is made mostly statically, however, there are applications in which dynamic read out is desired. In fact, there are applications which require very fast read out and the proposed encoder is not suitable for such applications.

In order to solve the problems, use may be made of pulsating light sources so that images of the patterns on the code carrying medium be projected statically on the sensor. The solution is not however recommendable because light sources of a high intensity have to be used and the apparatus will become bulky and expensive. The read out speed may be increased by increasing the length of the address pattern but this solution causes an increase in the length of the block. This is advantageous in view of the fact that it is desirable for increasing the accuracy of the reading to perform the reading in as many blocks as possible.

Where the principle of the encoder as proposed by the above-mentioned U.S. patent application is applied to a rotary type apparatus, there further arises the problem that coded patterns arranged on a circular track are read by means of a linear array of photoelectric elements so that a certain amount of error cannot be avoided. Further, the arrangement is also disadvantageous in making the code carrying disc small.

It is therefore an object of the present invention to provide an absolute encoder in which fast and fine read out can be carried out.

Another object of the present invention is to provide an encoder which includes a code carrying medium having a plurality of blocks, each having address patterns and coded bars which are so arranged that the length of the block can be decreased.

A further object of the present invention is to provide an encoder which does not produce any problem when it is applied to a rotary type apparatus.

According to the present invention, the above and other objects can be accomplished by an encoder comprising a code carrying medium movable with respect to photoelectrical sensor means in one direction, said code carrying medium having a first track formed with a plurality of first blocks arranged along said direction of movement of the code carrying medium, each of said first blocks carrying address information elements of the particular block recorded in a direction crossing to said direction of movement of the code carrying medium, and a second track parallel with said first track and formed with a plurality of second blocks arranged along said direction of movement, each of said second blocks carrying reference position information representing a reference position of the particular one of said second blocks and a plurality of coded bar patterns arranged with a first predetermined effective pitch in series along said direction of movement of said code carrying medium, said photoelectrical sensor means having a plurality of sensing elements arranged in series with a second predetermined effective pitch which is slightly different from said first predetermined pitch of said coded bar patterns to produce a vernier relationship with said coded bar patterns, said photoelectrical sensor means being arranged with respect to said code carrying medium so that the sensing elements in said sensor means read the informations and patterns on said code carrying medium to produce an output representing a relative movement between said code carrying medium and said photoelectrical sensor means. In a preferable mode of the present invention, the sensing elements in said photoelectrical sensing means are arranged so that they read directly the patterns and the information elements on said second track and optical means is provided for relaying images of the informations on said first track to said sensing means so that the information elements on said first track are read by said sensing elements in the photoelectrical sensor means. The optical means may include reflecting means for rotating the images of the information elements on the first track so that the information elements on the first track can be read by the same sensing elements. Alternatively, the sensor means may include two linear arrays of sensing elements respectively for reading the first and second tracks. The coded bar patterns on the code carrying medium may be projected on the photoelectrical sensor means with 1:1 magnification. In such a case, the actual pitch of the coded bar patterns must be slightly different from the actual pitch of the sensing elements of the sensor means to produce the vernier relationship. Alternatively, the actual pitch of the coded bar patterns may be the same as that of the sensing elements but the former may be slightly changed by suitable optical means when the patterns are projected on the sensor means.

Preferably, the second blocks in said second track are arranged with a pitch larger than that of said first blocks in said first track. The code carrying medium may further include at least one reference track for representing a reference position in a direction crossing said direction of movement of the code carrying medium. When the present invention is applied to a rotary type apparatus, the first and second tracks are formed coaxially along the periphery of a rotatable disc.

The above and other objects and features of the present invention will become apparent from the following descriptions of preferred embodiments taking reference to the accompanying drawings, in which:

FIG. 1 is an enlarged view of a code carrying medium showing coded patterns in accordance with one embodiment of the present invention;

FIG. 3 is a view showing the relationship between the code pattern and a linear array of photoelectrical elements constituting the photoelectrical sensor;

Figure 5:
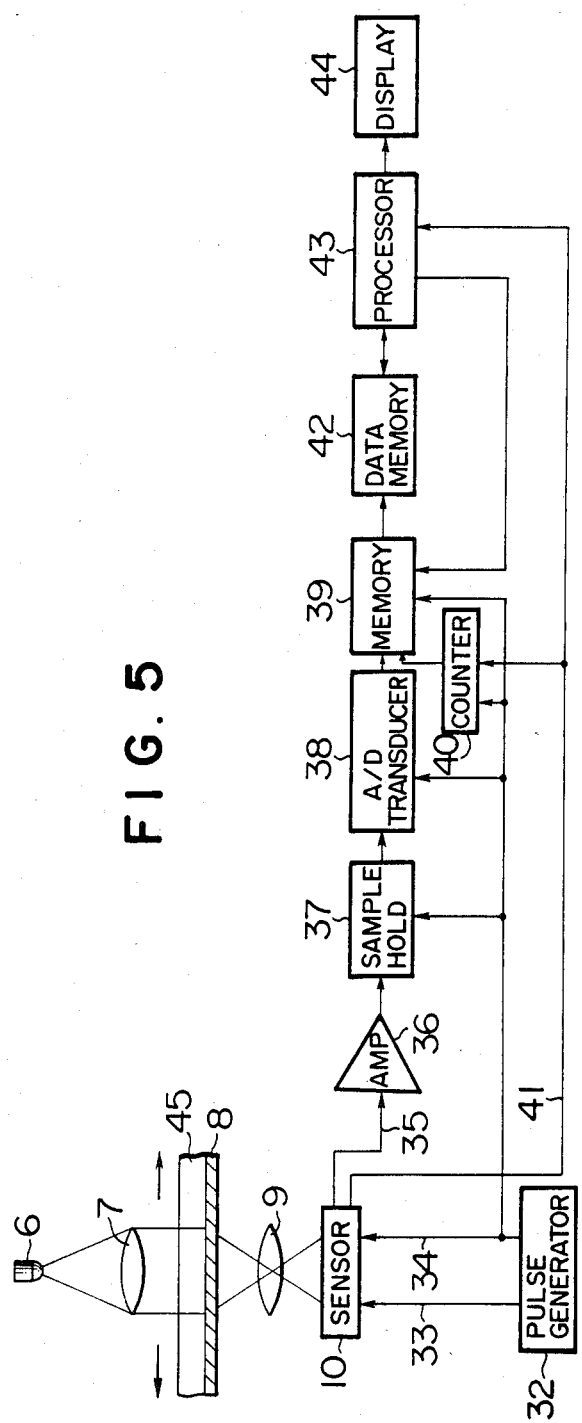
FIG. 5 is a block diagram showing the overall arrangement of the encoder embodying the features of the present invention.
Figure 6:
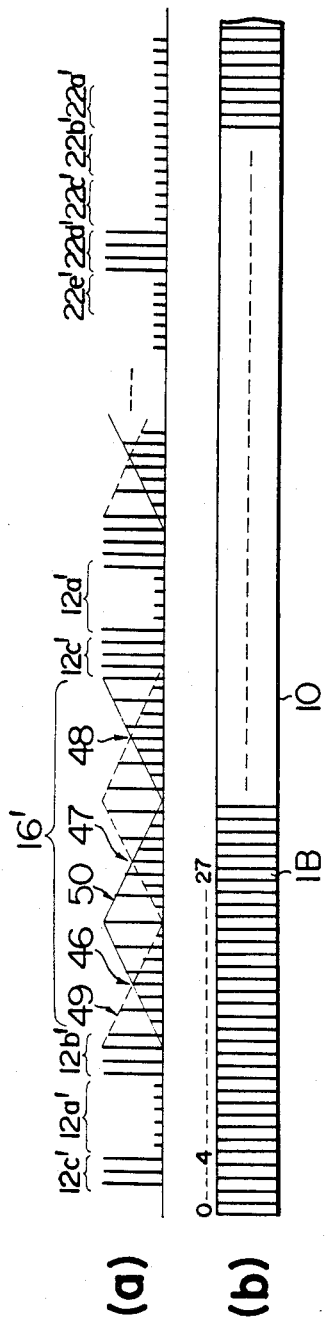
Figure 7:
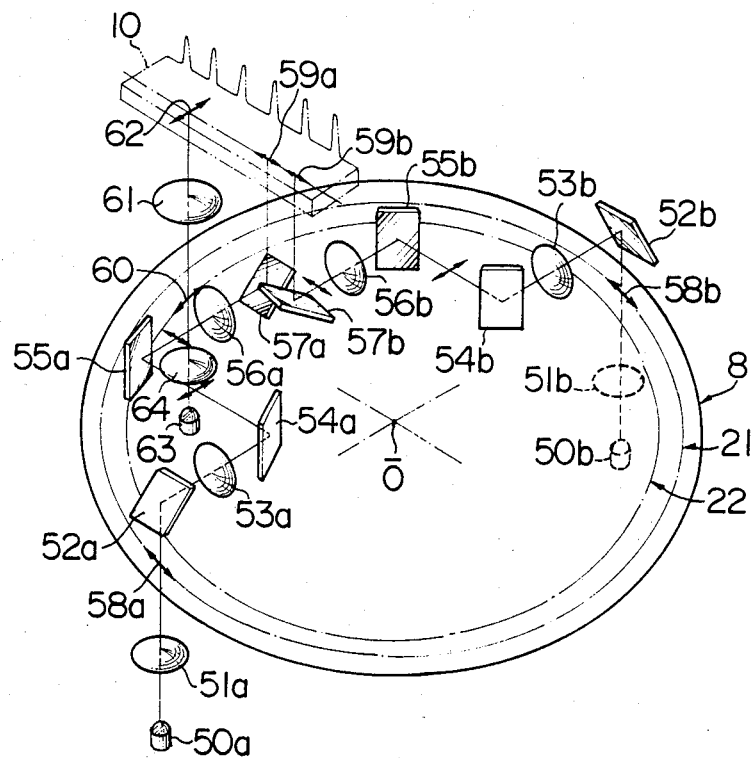
Figure 8:
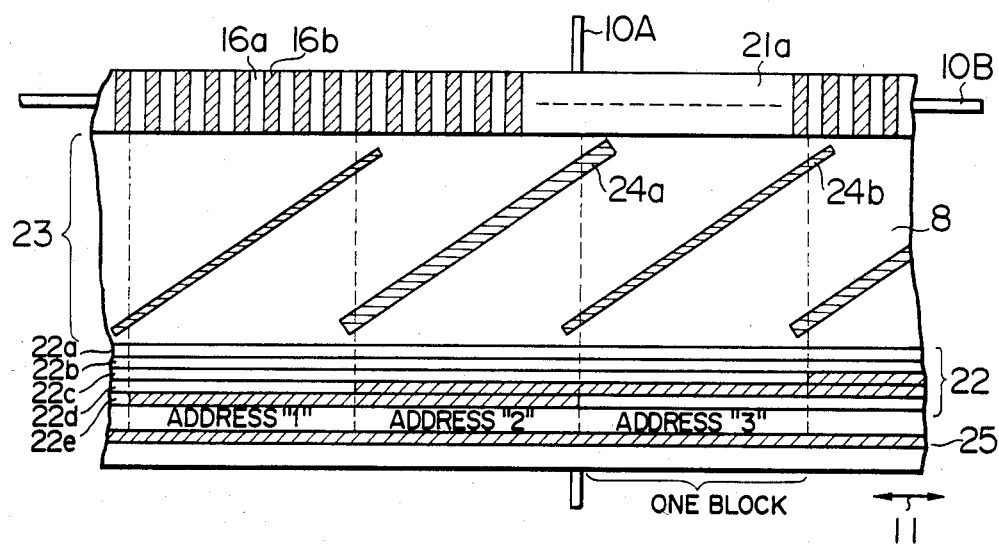

FIGS. 6 (a) and (b) are diagrams showing the operations of the processing circuit in the encoder shown in FIG. 5;

FIG. 7 is a perspective view of an optical system showing another embodiment of the present invention; and, FIG. 8 is a view similar to FIG. 1 but showing a further embodiment of the present invention.

Referring now to the drawings, particularly to FIG. 1, there is shown a code carrying medium 8 in accordance with one embodiment of the present invention. The medium includes a fine reading track 21 and a rough reading track 22 which are parallel with each other and extending in the lengthwise direction of the medium 8. The medium 8 is moved in the direction shown by an arrow 11 in FIG. 1. The fine reading track 21 is divided into a plurality of blocks 21a which are arranged in series along the length of the track 21. In each of the blocks 21a, there are formed a mark pattern 12 and a code bar pattern 16. The mark pattern 12 includes transparent portion 12a and an opaque portion 12b whereas the code bar pattern 16 includes a series of alternately arranged transparent and opaque bars 16a and 16b of a regular pitch.

The rough reading track 22 is divided into a plurality of blocks 23 which are arranged in series along the length of the track 22. In each of the blocks 23, there is formed an address pattern 23a which contains information identifying the address of the particular block 23. In each block 23, the address pattern 23a is recorded in the direction perpendicular to the direction 11 of movement of the medium 8 will be described in more detail later. Beneath the code carrying medium 8, there is a photoelectrical sensing device 10 comprising line sensors 10A and 10B. Each of the line sensors 10A and 10B includes a linear array of photoelectrical elements as well known in the art.

Figure 2:
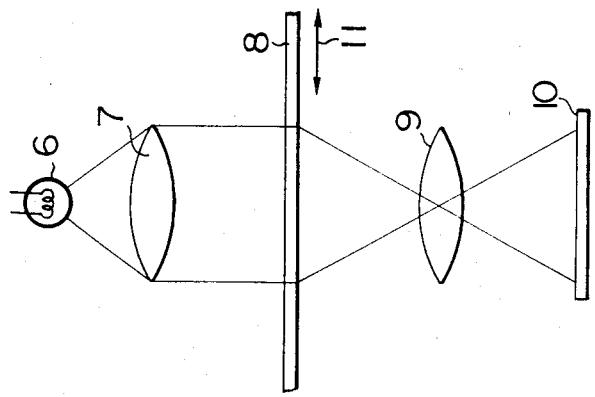
FIG. 2 is a diagrammatical illustration of an optical system which can be adopted in the encoder embodying the present invention.

FIG. 2 shows an optical system for reading the patterns on the medium 8 by means of the sensing device 10. The optical system includes a light source 6 and a condenser lens 7 for directing the beam of light from the light source 6 to the medium 8. The light beam which has passed through the medium 8 is focused by an imaging lens 9 on the sensing device 10 to produce an image of the patterns on the medium 8.

Referring to FIG. 3, there is shown the relationship between the code bar pattern 16 and the linear sensor 10B. As described, the linear sensor 10B includes a linear array of photoelectrical sensing elements 15 which are arranged with a regular pitch P. Each of the bars 16a and and 16b in the code bar pattern 16 has a width W. The pitch P of the elements 15 in the line sensor 10B and the width W of each bar 16a or 16b in the code bar pattern 16 are slightly different from each other so as to produce a vernier relationship therebetween. In the specific example shown in FIG. 3, the length containing ten code bars 16a and 16b is equal to the length containing eleven photoelectric elements 15 so that one-tenth of the pitch P of the photoelectric element can be detected by the principle of the vernier scale. The mark pattern 12 is provided for detecting the particular element or elements 15 on which the pattern 12 is projected and calculating the distance between such element or elements and a predetermined one of the elements which is usually referred to as an "index bit IB" to thereby make it possible to read the relative position of the specific block 21a with respect to the line sensor 10B by the order of the pitch P of the elements 15.

Referring back to FIG. 1, the rough reading track 22 is divided into a plurality of sub-tracks 22a through 22e which are arranged in a direction perpendicular to the direction of movement of the medium 8. In each of the blocks 23, the sub-tracks 22a through 22e are coded in a binary method so as to form the aforementioned address pattern 23a. The line sensor 10A is constructed in the same way as the line sensor 10B and arranged with its lengthwise direction coincided with the direction of arrangement of the sub-tracks 22a through 22e. Thus, it is possible to detect the address of a particular block 23 by the linear sensor 10A. It is therefore possible to carry out the reading based on the pitch P of the photoelectric element 15 and the fine reading based on the principle of vernier scale to thereby determine the relative position of the code carrying medium 8 with respect to the sensing device 10.

Figure 4:
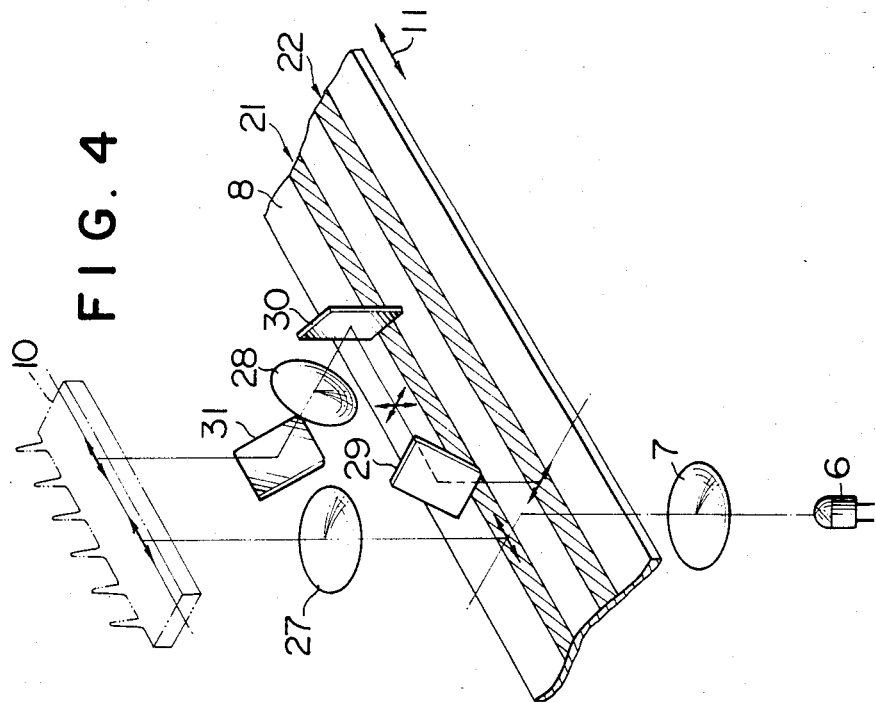
FIG. 4 is a perspective view showing another example of the optical system which can be used in the present invention.

FIG. 4 shows a modified form of the optical system which may be used with the code carrying medium 8 shown in FIG. 1. The optical system shown in FIG. 4 is intended to make it possible to read the information element by a single linear sensor 10. The beam of light from the light source 6 is passed through the condenser lens 7 and then through the code carrying medium 8. The portion of the light beam which has passed through the fine reading track 21 is projected through the focusing lens 27 to the sensor 10. The portion of the light beam which has passed through the rough reading track 22 is reflected by mirrors 29 and 30 so that the images of the patterns on the track 22 are rotated by 90°. The light beam from the mirror 30 is then passed through a focusing lens 28 and reflected by a mirror 31 to be projected on the sensor 10. Thus, the pattern recorded transversely on the track 22 is projected on the sensor 10 longitudinally along the array of the photoelectric elements in the sensor 10.

It will be understood from the foregoing descriptions that the patterns for fine reading are provided on a track separated from the track where the rough reading patterns are provided. Further, the binary bits constituting the rough reading patterns are arranged in a direction crossing the direction of the relative movement of the code carrying medium 8. It is therefore possible to obtain an increased density of the fine reading patterns and to decrease the length of each recording block. The arrangements are thus convenient in reading more than one block for the purpose of ensuring accuracy of measurement, because the area of illumination may not necessarily be broadened. Even when the patterns are recorded on arcuate tracks, the reading can be carried out by a linear array of sensing elements without producing any significant error. Further, the reading can be made more rapidly than the previously discussed prior art.

In the embodiment shown in FIG. 1, it will be noted that the rough reading track 22 has two blocks 23 in a length corresponding to one block length in the fine reading track 21. This arrangement is advantageous in preventing possible reading errors when the sensor 10A is on the border between two adjacent blocks on the rough reading track 22. Assuming in FIG. 1 that the sensor 10A is on the border between the block for the address "0" and the block for the address "1", the address reading will take the value "0" or "1" so that there will be a possibility of producing a large error if the value is simply added to the value of the fine reading. In the arrangement shown in FIG. 1, the possibility of such an error can be avoided by the following procedure. For the purpose of explanation, it is assumed that the sensor 10B includes one hundred elements in the length corresponding to one block length on the fine reading track 8. When the address value as read by the sensor 10A is an odd number and the value of fine reading is greater than "twenty-five", the value "one" is subtracted from the address value, but the value "one" is added when the fine reading is smaller than "twenty-five". When the address value is an even number, the value "two" is subtracted from the address value where the fine reading value is greater than "seventy-five" whereas the address value is adopted as it is where the fine reading value is smaller than "seventy-five". It is preferred to adopt gray codes for the address codes in order to avoid reading errors at the border of the address code blocks.

Referring now to FIG. 5, the code carrying medium 8 in accordance with one embodiment of the present invention is placed on a movable member 45 such as a movable table of a machine tool. The information elements on the medium 8 are read by an optical system including a light source 6, a condenser lens 7 and an imaging lens 9, and a photoelectric sensing device 10. The medium 8 carries coded patterns as shown in FIG. 1 and the optical system as shown in FIG. 2 may be used together with the linear sensors 10A and 10B as shown in FIG. 1. Alternatively, the optical system as shown in FIG. 4 may be used together with a single linear sensor 10.

A pulse generator 32 is associated with the sensor 10 to apply thereto a start pulse 33 and a clock pulse 34. The sensor 10 starts to operate as soon as the start pulse 33 is received from the pulse generator 32 and produces an output 35 in synchronism with the clock pulse 34 from the pulse generator 32. The output 35 from the sensor 10 is applied to an amplifier 36 which has an output connected with a sample hold 37. The sample hold 37 functions to store as an analogue voltage the peak value of the output of each sensing element of the sensor 10. The output of the sample hold 37 is connected with an analogue-digital transducer 38 which converts the analogue voltage signal from the sample hold 37 to a digital value. The output of the transducer 38 is connected with a digital memory 39 where the output signals from the sensor 10 are sequentially memorized. The digital memory 39 may be of a random access type and a counter 40 may be provided for receiving the clock pulse from the pulse generator 32. The output of the counter 40 is applied to the memory 39 to sequentially store the output signals from the sequential elements in the sensor 10 whereby the addresses of the respective ones of the memorized signals can have direct correspondence with the bit numbers of the sensor 10. It should of course be noted that the counter 40 must be reset either by the start pulse 33 or an end pulse 41 which may be applied thereto from the sensor 10. A signal processing circuit 43 is provided for receiving the scan end pulse 41 from the sensor 10 and functions to transfer the data in the memory 39 to a data memory 42 when the scan end pulse 41 is received to perform data processing.

Referring now to FIGS. 1 and 6, it should be noted that the transparent portion 12a in the mark pattern 12 has a length corresponding to six sensing elements in the sensor 10 whereas the opaque portion 12b has a length corresponding to three elements in the sensor 10. Further, each block 21a in the fine reading track 21 has a block stop mark 12c at the end thereof, which comprises an opaque portion having a length corresponding to three elements in the sensor 10. The code bar pattern 16 includes thirty transparent and opaque bars 16a and 16b. Each of the sub-tracks 22a through 22e in the rough reading track 22 has a width corresponding to four elements in the sensor 10. When the patterns on the medium 8 are projected on a sensor 10 as shown in FIG. 6(b), the elements in the sensor 10 produce output pulses as shown in FIG. 6(a) where they receive images of the transparent portions. Then, the data processing is carried out by the following procedures.

(1) The beginning of the transparent portion 12a of the mark pattern 12 is detected by the decrease of the output pulse level in the output pulse of the sensor 10. In the example shown in FIG. 6, this is detected by the No. 4 element in the sensor 10.

(2) The distance between the element referred to in the paragraph (1) and the index bit element 1B is detected. In the example shown in FIG. 6, No. 27 element is selected as the index bit so that the distance corresponds to twenty-three elements. Where the sensing elements are arranged with a pitch of 10 μm, the distance is 230 μm.

(3) Cyclic patterns 49 and 50 are detected from the output pulses 16' which change as shown in FIG. 6(a) due to the vernier relationship between the code bar pattern 16 and the elements in the sensor 10. The points 46, 47 and 48 of intersection between the patterns 49 and 50 are then obtained through operation. In a specific example, the positions of the points 46, 47 and 48 may be 18.3, 31.2 and 40.0, respectively. Then, a linear regressive calculation is performed based on these values and a more accurate position for the point 46 is obtained as 18.98. It is thus possible to obtain a more accurate result by providing an increased number of code bars for performing averaging operations. This can be done by separating the address pattern blocks from the fine reading pattern blocks to thereby increase the area available for the code bars. It will be understood that due to the vernier relationship described previously, the positions of the intersections 46, 47 and 48 move significantly in response to a very small movement between the code carrying medium 8 and the sensor 10 as fully discussed in the aforementioned patent application.

Where it is preliminarily determined that the zero position for the intersection 46 is separated toward right by a distance corresponding to ten elements in the sensor 10, the fine reading can be obtained from the value as obtained in the paragraph (1) and the value as obtained in this paragraph by carrying out the following calculation.

$$18.98 - (10 + 4) = 4.98$$

This means that the intersection 46 is shifted by a distance equal to 4.98 times the pitch between the elements in the sensor. Since there is a vernier relationship of 10:11 and the pitch between the elements is 10 μm, the fine reading is 4.98 μm.

(4) Then, the address of the particular block in question is read from the patterns in the rough reading track 22.

(5) From the values obtained in the paragraphs (2) and (3), the lower digits of measurement can be obtained as follows.

$$230 \ \mu m + 4.98 \ \mu m = 234.98 \ \mu m$$

The value is then added to the value as obtained by the address code in the paragraph (4) to determine the relative displacement between the code carrying medium 8 and the sensor 10.

Referring now to FIG. 7, there is shown a further embodiment of the present invention in which the concept of the present invention is applied to a rotating apparatus. In this embodiment, the code carrying medium 8 is in the form of a rotatable disc which is adapted to rotate about an axis O. The disc 8 has a peripheral portion formed with a circular fine reading track 21 and a circular rough reading track 22 both of which have patterns as the tracks 21 and 22 in the previous embodiment have. In the rotary type encoder, it is preferred to carry out reading at diametrically opposite positions to obtain an average value of readings so that a possible error due to an eccentricity of the disc 8 can be eliminated. Thus, the encoder shown in FIG. 7 has a pair of optical systems for reading the patterns in the fine reading track 21 at diametrically opposite positions. Since the eccentricity of the disc 8 is not large, it is unnecessary to read the rough reading track at two positions.

The optical system for reading the fine reading track 21 at one position 58a includes a light source 50a and a condenser lens 51a for directing a beam of light to the fine reading track 21 of the disc 8. The light beam which has passed through the fine reading track 21 is reflected by a mirror 52a and passed through a relay lens 53a to a mirror 54a to be reflected thereby. The light beam as reflected by the mirror 54a is directed to a further mirror 55a to be reflected toward an imaging lens 56a. The light beam which has passed through the lens 56a is again reflected by a mirror 57a toward a photoelectric sensor 10 to produce images 59a of the patterns on the fine reading track 21. For carrying out a similar reading at the diametrically opposite position 58b, there is provided another optical system which is essentially the same as that described above. Therefore, corresponding parts are shown by the same reference numerals with suffix b but detailed descriptions will not be made.

There is further provided an optical system including a light source 63 and a condenser lens 64 for directing a beam of light from the light source 63 to the rough reading track 22. The light beam which has passed through the rough reading track 22 at a position 60 is passed through an imaging lens 61 to the sensor 10 to form thereon images 62 of the patterns on the rough reading track 22.

FIG. 8 shows a further embodiment of the present invention in which the code carrying medium 8 has four separated tracks. More particularly, the medium 8 has a fine reading track 21a having code bars 16a and 16b which are of vernier relationship with photoelectric elements in the line sensor 10B, a track 23 having slanted or oblique patterns 24a and 24b which are to be detected by the sensor 10A, a rough reading track 22 having address patterns, and a reference track 25 for determining the position in the direction perpendicular to the direction 11 of movement of the medium 8. The medium 8 is divided into a plurality of blocks which are arranged in series in the direction 11 of movement of the medium 8. The address track 22 has address patterns for determining the addresses of the respective blocks. Fine readings can be made by the sensor 10B which detects the code bar patterns on the track 21a in the same manner as in the previous embodiment.

The oblique patterns 24a and 24b extend slightly beyond the lengths of the respective blocks and are distinguishable from adjacent patterns by for example providing different widths. These patterns are provided for eliminating possible reading errors in the border between two adjacent blocks. The operations are carried out in the following procedures.

(1) Where the sensor 10A detects that a thinner pattern 24b is above a thicker pattern 24a and the address reading is of an odd number, the address reading itself is added with a value as obtained by reading the thinner pattern 24b. Where the address reading is of an even number, the address reading is subtracted by one and added with the reading of the thinner pattern 24b.

(2) Where a thicker pattern 24a is above a thinner pattern 24b and the address reading is of an even number, the address reading itself is added with the value as obtained by reading the thicker pattern 24a. Where the address reading is of an odd number, the address reading is subtracted with one and added with the reading of the thicker pattern.

The reference track 25 on the medium 8 determines the reference position of the medium 8 with respect to the sensor 10A. The positions of the oblique patterns 24a and 24b are detected by the sensor 10A in terms of a distance between the positions where images of the patterns are projected on the sensor 10A and a reference position which can be preliminary determined on the sensor 10A. In order to eliminate possible errors due to possible displacement between the code carrying medium 8 and the sensor 10A in the direction perpendicular to the direction 11, the reference track 25 is provided and the reference position on the sensor 10A is determined as the position where the image of the track 25 is projected. It should further be noted that by detecting the position of the track 25 on the sensor 10A, it becomes possible to detect the positions of the sub-tracks 22a through 22e of the rough reading track 22 more accurately. Thus, it becomes unnecessary to make adjustments so that the sub-tracks 22a through 22e be projected on predetermined positions on the sensor 10A. It should further be noted that, by providing a pair of reference tracks at the opposite sides of the rough reading track 22 to thereby make it possible to detect the width of the track 22 on the sensor 10A, it becomes unnecessary to make detailed adjustments of the power of the imaging lens and the alignment of the mirrors in the optical system.

The invention has thus been shown and described with reference to specific embodiments, however, it should be noted that the invention is in no way limited to the detailed of the illustrated arrangements but changes and modifications may be made without departing from the scope of the appended claims.

I claim:

1. An encoder comprising a code carrying medium movable with respect to photoelectrical sensor means in one direction, said code carrying medium having a first track formed with a plurality of first blocks arranged along said direction of movement of the code carrying medium, each of said first blocks carrying address information of the particular block recorded in a direction crossing said direction of movement of the code carrying medium, and a second track parallel with said first track and formed with a plurality of second blocks arranged along said direction of movement, each of said second blocks carrying reference position information representing a reference position of the particular one of said second blocks and a plurality of coded bar patterns arranged with a first predetermined effective pitch in series along said direction of movement of said code carrying medium, said photoelectrical sensor means having a plurality of sensing elements arranged in series with a second predetermined effective pitch which is slightly different from said first predetermined pitch of said coded bar patterns to produce a vernier relationship with said coded bar patters, said photoelectrical sensor means being arranged with respect to said code carrying medium so that the sensing elements in said sensor means read the information and patterns on said code carrying medium to produce an output representing a relative movement between said code carrying medium and said photoelectrical sensor means, said sensing elements in said photoelectrical sensor means being arranged so that they read directly an image of one of said first and second blocks, and further comprising reflecting means for rotating an image of the other of said first and second blocks so that said address information on said first track and said patterns and information on said second track can be read by said sensing elements.

2. A rotary encoder comprising:
a code carrying medium being formed of a rotatable circular disc and including a first track concentric with said disc formed with a plurality of first blocks arranged along a circumferential direction, each of said first blocks carrying address information of the particular block recorded in a radial direction of said disc, and a second track being concentric with said first track and formed with a plurality of second blocks arranged along said circumferential direction, each of said second blocks carrying reference position information representing a reference position of the particular one of said second blocks and a plurality of coded bar patterns arranged with a first predetermined effective pitch in series along said circumferential direction;
photoelectrical sensor means disposed along a radial line of said disc and having a plurality of sensing elements arranged in series with a second predetermined effective pitch which is slightly different from said first predetermined pitch of said coded bar patterns to produce a vernier relationship with said coded patterns; and
optical means being provied for relaying an image of one of said first and second blocks to said photoelectrical sensor means, said image of the one of said first or second blocks being perpendicularly oriented with respect to said radial line, wherein said photoelectrical sensor means reads directly an image of the other of said first and second blocks and reads through said optical means said image of said one of said first and second blocks so that said address information on said first track and said reference position information and coded bar patterns on said second track can be read simultaneously by said photoelectrical sensor means.

* * * * *